United States Patent
Lim et al.

(10) Patent No.: US 8,812,920 B2
(45) Date of Patent: Aug. 19, 2014

(54) TEST MODE SIGNAL GENERATION CIRCUIT

(75) Inventors: Yu Ri Lim, Icheon-si (KR); Min Su Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 189 days.

(21) Appl. No.: 13/604,351

(22) Filed: Sep. 5, 2012

(65) Prior Publication Data

US 2013/0318407 A1    Nov. 28, 2013

(30) Foreign Application Priority Data

May 25, 2012    (KR) .................. 10-2012-0056013

(51) Int. Cl.
*G11C 29/00*    (2006.01)

(52) U.S. Cl.
USPC .......................... 714/718; 714/724

(58) Field of Classification Search
CPC  G01R 31/31701; G06F 11/263; G11C 29/46; G11C 29/02; G11C 29/28
USPC ............ 365/201, 222; 324/762.01; 714/718, 714/724
See application file for complete search history.

(56) References Cited

U.S. PATENT DOCUMENTS

| | | | |
|---|---|---|---|
| 6,462,996 B2 * | 10/2002 | Ooishi | 365/201 |
| 6,754,127 B2 * | 6/2004 | Ooishi | 365/222 |
| 7,107,500 B2 * | 9/2006 | Jang | 714/718 |
| 7,689,883 B2 * | 3/2010 | Seo | 714/724 |
| 2011/0025364 A1 * | 2/2011 | Yun | 324/762.01 |
| 2011/0158015 A1 * | 6/2011 | Yun et al. | 365/201 |

FOREIGN PATENT DOCUMENTS

| KR | 10-2010-0055036 A | 5/2010 |
|---|---|---|
| KR | 10-2011-0075349 A | 7/2011 |

* cited by examiner

*Primary Examiner* — David Ton
(74) *Attorney, Agent, or Firm* — William Park & Associates Patent Ltd.

(57) ABSTRACT

A test mode signal generation circuit includes a pre-decoder block configured to output first and second control signals and test address signals in response to first and second address signals, and a signal generation block configured to decode the test address signals in response to the first control signal and generate first and second test mode group signals each including a plurality of test mode signals.

21 Claims, 2 Drawing Sheets

TEST MODE SIGNAL GENERATION CIRCUIT

CROSS-REFERENCES TO RELATED APPLICATION

The present application claims priority under 35 U.S.C. §119(a) to Korean application number 10-2012-0056013, filed on May 25, 2012, in the Korean Intellectual Property Office, which is incorporated herein by reference in its entirety.

BACKGROUND

1. Technical Field

The present invention relates generally to a test mode signal generation circuit, and more particularly, to a test mode signal generation circuit which generates test mode signals from address signals.

2. Related Art

A semiconductor memory apparatus has various test modes for checking fails that occur during processes. Recent results show that as processes for fabricating a semiconductor memory apparatus are refined, fails increasingly occur, and the number of test modes necessary to check the fails that increasingly occur increases.

In a conventional test mode signal generation method, a plurality of test mode signals (TM<0:M>) are generated by decoding a plurality of address signals (A<0:N>). For example, if 7 addresses are inputted to generate test mode signals, test mode signals capable of entering 128 different test modes may be generated. Accordingly, in the case where the test mode signals are directly transmitted through global lines, the number of the global lines must be 128. The more global lines that are disposed in a peripheral region where a large number of circuits are provided for normal operations of a semiconductor apparatus, wiring increases in complexity and a layout margin decreases. Also, in the conventional test mode signal generation method, a limited number of test mode signals must be generated since the number of address signals is limited.

SUMMARY

In one embodiment of the present invention, a test mode signal generation circuit includes: a pre-decoder block configured to output first and second control signals and test address signals in response to first and second address signals; and a signal generation block configured to decode the test address signals in response to the first control signal and generate first and second test mode group signals each of which include a plurality of test mode signals.

In another embodiment of the present invention, a test mode signal generation circuit includes: a pre-decoder block configured to output a plurality of control signals and a plurality of test address signals in response to a plurality of address signals; and a signal generation block configured to decode the plurality of test address signals in response to the plurality of control signals, and to generate a plurality of test mode group signals each of which include test mode signals such that the respective numbers of test mode signals of the respective test mode group signals increase exponentially, wherein the plurality of test mode group signals include first test mode group signal to $m^{th}$ test mode group signal (m is a natural number equal to or greater than 2). When the number of the plurality of test address signals is n (n is a natural number), the number of the test mode signals included in the first and $m^{th}$ test mode group signal is $2^{(1*n)}$ and $2^{(m*n)}$, respectively.

In another embodiment of the present invention, a test mode signal generation circuit includes: a signal generation block configured to decode a plurality of address signals in response to a plurality of control signals, and to generate a plurality of test mode group signals each including test mode signals such that the respective numbers of test mode signals of the respective test mode group signals increase exponentially, wherein the plurality of test mode group signals include first test mode group signal to $m^{th}$ test mode group signal (m is a natural number equal to or greater than 2). When the number of the plurality of address signals is n (n is a natural number), the number of the test mode signals included in the first and $m^{th}$ test mode group signal is $2^{(1*n)}$ and $2^{(m*n)}$, respectively.

BRIEF DESCRIPTION OF THE DRAWINGS

Features, aspects, and embodiments are described in conjunction with the attached drawings, in which.

DETAILED DESCRIPTION

Hereinafter, a test mode signal generation circuit according to an embodiment of the present invention will be described below with reference to the accompanying drawings through various embodiments.

Figure 1:
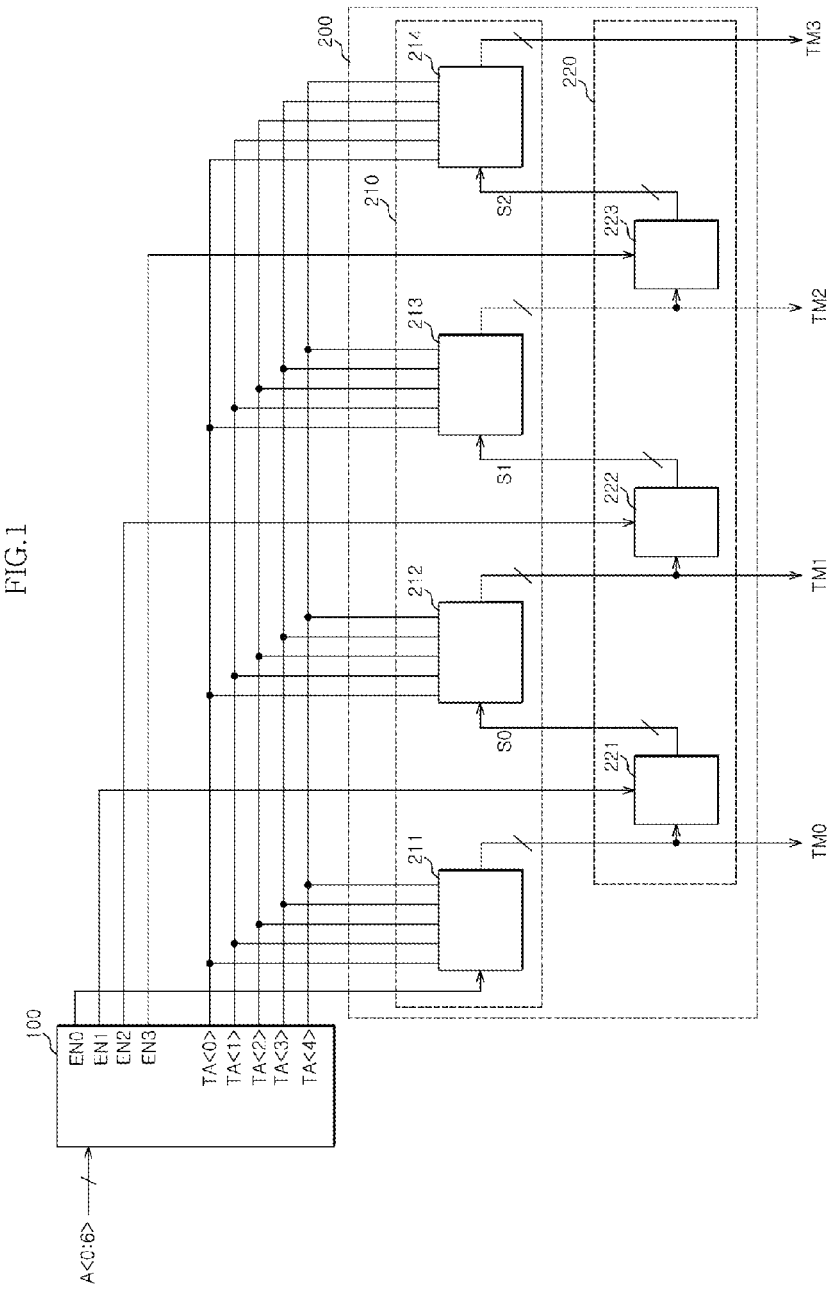
FIG. 1 is a block diagram showing a test mode signal generation circuit in accordance with an embodiment of the present invention.

FIG. 1 is a block diagram showing a test mode signal generation circuit in accordance with an embodiment of the present invention.

A test mode signal generation circuit in accordance with an embodiment of the present invention includes a pre-decoder block 100 and a signal generation block 200, which includes an address decoder section 210 and an enable signal generating section 220. The address decoder section 210 includes first to fourth address decoder units 211, 212, 213 and 214, and the enable signal generating section 220 includes first to third enable signal generation units 221, 222 and 223.

Operations of the test mode signal generation circuit in accordance with an embodiment of the present invention will be described below with reference to FIG. 1.

The pre-decoder block 100 is configured to receive a plurality of address signals A<0:6> and generate a plurality of control signals EN0 to EN3 and a plurality of test address signals TA<0:4>.

The pre-decoder block 100 generates the plurality of control signals EN0 to EN3 by decoding some of the plurality of address signals A<0:6>, and outputs the remaining address signals as the plurality of test address signals TA<0:4>. For example, the pre-decoder block 100 generates the first to fourth control signals EN0 to EN3 using the first and second address signals A<0:1>, and outputs the remaining third to seventh address signals A<2:6> as the first to fifth test address signals TA<0:4>.

The signal generation block 200 is configured to generate a plurality of test mode group signals TM0 to TM3 in response to the plurality of test address signals TA<0:4> and the plurality of control signals EN0 to EN3. Each of the plurality of test mode group signals TM0 to TM3 includes a plurality of test mode signals.

The address decoder section 210 is configured to output the plurality of test mode group signals TM0 to TM3 in response to the first control signal EN0 and first to third enable group signals S0 to S2. The enable signal generating section 220 is configured to generate the first to third enable group signals S0 to S2 in response to the first to third test mode group signals TM0 to TM2 and the second to fourth control signals EN1 to EN3.

The first address decoder unit 211 is configured to decode the first to fifth test address signals TA<0:4> when the first control signal EN0 is enabled, and output the first test mode group signal TM0, which may include a plurality of test mode signals. In the present embodiment of the invention, the first address decoder unit 211 receives the first to fifth test address signals TA<0:4> and outputs a maximum of 2^5 test mode signals to the first test mode group signal TM0.

The first enable signal generation unit 221 is configured to generate the first enable group signal S0 in response to the first test mode group signal TM0 and the second control signal EN1. The first enable signal generation unit 221 may be constituted by a plurality of logic elements, such as AND gates. The number of the plurality of logic elements included in the first enable signal generation unit 221 may be the same as the number of the plurality of test mode signals included in the first test mode group signal TM0, 2^5. The respective logic elements receive the second control signal EN1 and the plurality of respective test mode signals, perform a logic operation, and generate the first enable group signal S0 including 2^5 enable signals.

The second address decoder unit 212 is configured to decode the first to fifth test address signals TA<0:4> when enabled in response to the first enable group signal S0, and output the second test mode group signal TM1.

The second address decoder unit 212 includes a plurality of address decoders, which receive the first to fifth test address signals TA<0:4> and a plurality of enable signals included in the first enable group signal S0. There may be 2^5 address decoders in the second address decoder unit 212 to match the number of enable signals included in the first enable group signal S0, to decode the first to fifth test address signals TA<0:4> in response to the first enable group signal S0, and accordingly output a maximum of 2^5 test mode signals. Since each address decoder outputs a maximum of 2^5 test mode signals, the second address decoder unit 212 resultantly outputs the second test mode group signal TM1 with a maximum of 2^10 test mode signals.

The second enable signal generation unit 222 is configured to generate the second enable group signal S1 in response to the second test mode group signal TM1 and the third control signal EN2, and may be constituted by a plurality of logic elements, such as AND gates. The number of the plurality of logic elements included in the second enable signal generation unit 222 may be the same as the number of a plurality of test mode signals included in the second test mode group signal TM1, 2^10. The respective logic elements receive the third control signal EN2 and the plurality of respective test mode signals, perform a logic operation, and generate the second enable group signal 51 including 2^10 enable signals.

The third address decoder unit 213 includes a plurality of address decoders, which receive the first to fifth test address signals TA<0:4> and a plurality of enable signals included in the second enable group signal S0. There may be 2^10 address decoders in the third address decoder unit 213 to match the number of the enable signals included in the second enable group signal S1, to decode the first to fifth test address signals TA<0:4> in response to the second enable group signal S1, and accordingly output a maximum of 2^5 test mode signals. Since each address decoder outputs a maximum of 205 test mode signals, the third address decoder unit 213 resultantly outputs the third test mode group signal TM2 with a maximum of 2^15 test mode signals.

The third enable signal generation unit 223 is configured to generate the third enable group signal S2 in response to the third test mode group signal TM2 and the fourth control signal EN3. The third enable signal generation unit 223 may be constituted by a plurality of logic elements, such as AND gates. The number of the plurality of logic elements included in the third enable signal generation unit 223 may be the same as the number of a plurality of test mode signals included in the third test mode group signal TM2, 2^15. The respective logic elements receive the fourth control signal EN3 and the plurality of respective test mode signals, perform a logic operation, and generate the third enable group signal S2 including 2^15 enable signals.

The fourth address decoder unit 214 includes a plurality of address decoders, which receive the first to fifth test address signals TA<0:4> and a plurality of enable signals included in the third enable group signal S2. There may be 2^15 address decoders in the fourth address decoder unit 214 to match the number of enable signals included in the third enable group signal S2, to decode the first to fifth test address signals TA<0:4> in response to the third enable group signal S2, and accordingly output a maximum of 2^5 test mode signals. Since each address decoder outputs a maximum of 2^5 test mode signals, the fourth address decoder unit 214 resultantly outputs the fourth test mode group signal TM3 with a maximum of 2^20 test mode signals.

In the signal generation block 200 in accordance with an embodiment of the present invention, the plurality of address decoder units 211, 212, 213 and 214 included in the address decoder section 210 and the plurality of enable signal generation units 221, 222 and 223 included in the enable signal generating section 220 generate the plurality of enable group signals S0 to S2 and the plurality of test mode group signals TM0 to TM3.

The test mode signal generation circuit in accordance with an embodiment of the present invention decodes the plurality of test address signals TA<0:4> in response to the plurality of control signals EN0 to EN3, and generates the plurality of test mode signals which are included binary-exponentially in the first to fourth test mode group signals TM0 to TM3.

The test mode signal generation circuit in accordance with an embodiment of the present invention decodes the plurality of test address signals TA<0:4> in response to the plurality of control signals EN0 to EN3, and outputs the first to fourth test mode group signals TM0 to TM3 at multiple stages.

Figure 2:
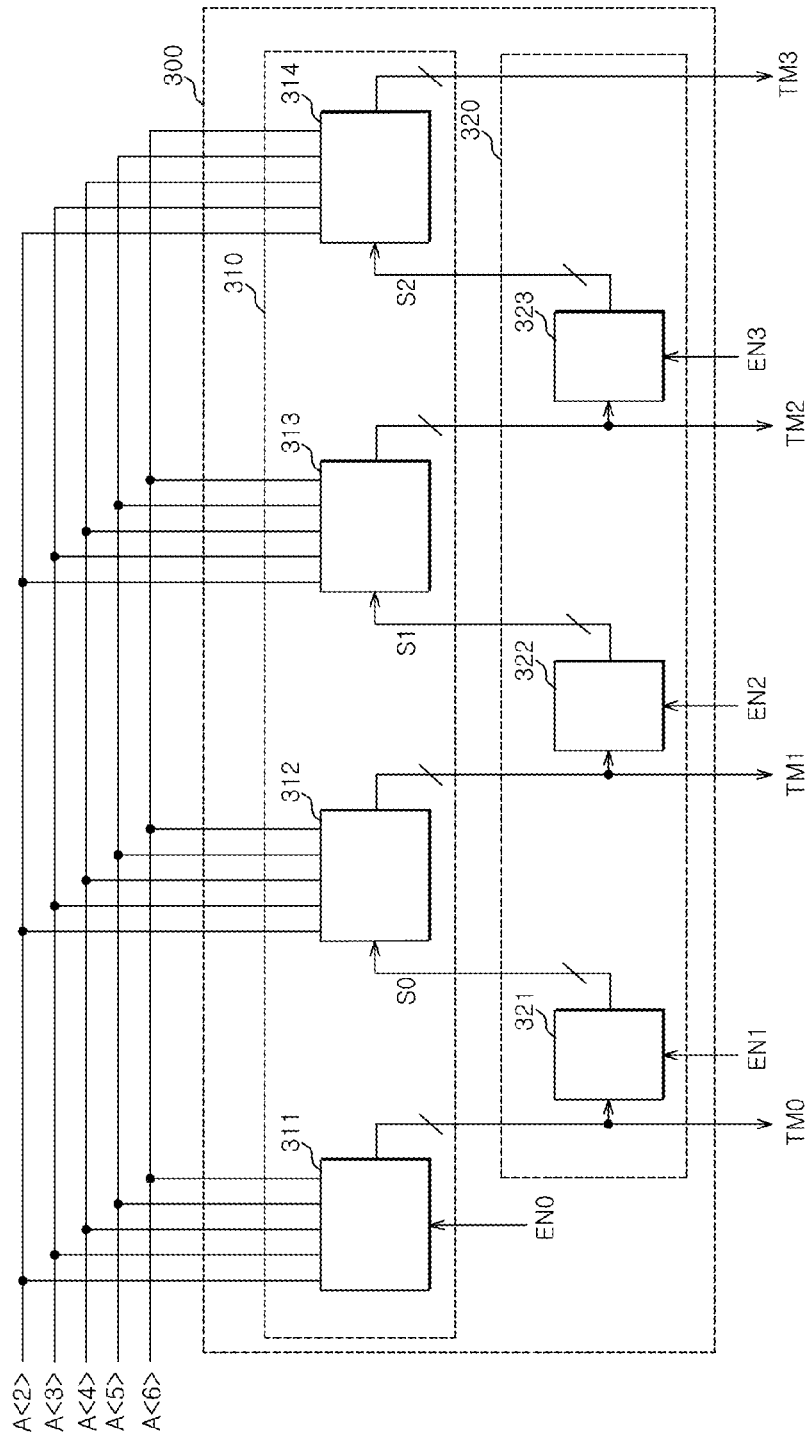
FIG. 2 is a block diagram showing a test mode signal generation circuit in accordance with another embodiment of the present invention.

FIG. 2 is a block diagram showing a test mode signal generation circuit in accordance with another embodiment of the present invention.

A test mode signal generation circuit in accordance with another embodiment of the present invention will be described below with reference to FIG. 2.

A test mode signal generation circuit in accordance with another embodiment of the present invention includes a signal generation block 300, which includes an address decoder section 310 and an enable signal generating section 320. The address decoder section 310 includes first to fourth address decoder units 311, 312, 313 and 314, and the enable signal generating section 320 includes first to third enable generation units 321, 322 and 323.

Operations of the test mode signal generation circuit in accordance with another embodiment of the present invention will be described below with reference to FIG. 2.

In the test mode signal generation circuit of FIG. 1, the plurality of address signals A<0:6> are decoded in advance before being inputted to the address decoder section 210, the plurality of control signals EN0 to EN3 and the plurality of test address signals TA<0:4> are generated, and the plurality of test mode group signals TM0 to TM3 are outputted. However, in the test mode signal generation circuit of FIG. 2, a plurality of address signals A<2:6> are directly inputted to the signal generation block 300, and a plurality of test mode group signals TM0 to TM3 are generated in response to a plurality of control signals EN0 to EN3. The plurality of control signals EN0 to EN3 used in the test mode signal generation circuit in accordance with another embodiment of the present invention shown in FIG. 2 may be signals which are generated by decoding address signals A<0:1>.

In FIG. 2, the signal generation block 300 is configured to generate the plurality of test mode group signals TM0 to TM3 in response to the plurality of address signals A<2:6> and the plurality of control signals EN0 to EN3. Each of the plurality of test mode group signals TM0 to TM3 includes a plurality of test mode signals.

The address decoder section 310 is configured to output the plurality of test mode group signals TM0 to TM3 in response to the first control signal EN0 and first to third enable group signals S0 to S2. The enable signal generating section 320 is configured to generate the first to third enable group signals S0 to S2 in response to the first to third test mode group signals TM0 to TM2 and the second to fourth control signals EN1 to EN3.

The first address decoder unit 311 is configured to decode the first to fifth address signals A<2:6> when the first control signal EN0 is enabled and generate the first test mode group signal TM0, which may include a plurality of test mode signals. The first address decoder unit 311 receives the first to fifth address signals A<2:6> and outputs a maximum of $2^5$ test mode signals to the first test mode group signal TM0

The first enable signal generation unit 321 is configured to generate the first enable group signal S0 in response to the first test mode group signal TM0 and the second control signal EN1. The first enable signal generation unit 321 may be constituted by a plurality of logic elements, such as AND gates. The number of the plurality of logic elements included in the first enable signal generation unit 321 may be the same as the number of a plurality of test mode signals included in the first test mode group signal TM0, $2^5$. The respective logic elements receive the second control signal EN1 and the plurality of respective test mode signals, perform a logic operation, and generate the first enable group signal S0 including $2^5$ enable signals.

The second address decoder unit 312 is configured to decode the first to fifth address signals A<2:6> when enabled in response to the first enable group signal S0, and generate the second test mode group signal TM1.

The second address decoder unit 312 includes a plurality of address decoders, which receive the first to fifth address signals A<2:6> and a plurality of enable signals included in the first enable group signal S0. There may be $2^5$ address decoders in the second address decoder unit 312 to match the number of the enable signals included in the first enable group signal S0, to decode the first to fifth address signals A<2:6> in response to the first enable group signal S0, and accordingly output a maximum of $2^5$ test mode signals. Since each address decoder outputs a maximum of $2^5$ test mode signals, the second address decoder unit 312 resultantly outputs the second test mode group signal TM1 with a maximum of $2^{10}$ test mode signals.

The second enable signal generation unit 322 is configured to generate the second enable group signal S1 in response to the second test mode group signal TM1 and the third control signal EN2, and may be constituted by a plurality of logic elements, such as AND gates. The number of the plurality of logic elements included in the second enable signal generation unit 322 may be the same as the number of a plurality of test mode signals included in the second test mode group signal TM1, $2^{10}$. The respective logic elements receive the third control signal EN2 and the plurality of respective test mode signals, perform a logic operation, and generate the second enable group signal S1 including $2^{10}$ enable signals.

The third address decoder unit 313 includes a plurality of address decoders, which receive the first to fifth address signals A<2:6> and a plurality of enable signals included in the second enable group signal S0. There may be $2^{10}$ address decoders in the third address decoder unit 313 to match the number of the enable signals included in the second enable group signal S1, to decode the first to fifth address signals A<2:6> in response to the second enable group signal S1, and accordingly output a maximum of $2^5$ test mode signals. Since each address decoder outputs a maximum of $2^5$ test mode signals, the third address decoder unit 313 resultantly outputs the third test mode group signal TM2 with a maximum of $2^{15}$ test mode signals.

The third enable signal generation unit 323 is configured to generate the third enable group signal S2 in response to the third test mode group signal TM2 and the fourth control signal EN3. The third enable signal generation unit 323 may be constituted by a plurality of logic elements, such as AND gates. The number of the plurality of logic elements included in the third enable signal generation unit 323 may be the same as the number of a plurality of test mode signals included in the third test mode group signal TM2, $2^{15}$. The respective logic elements receive the fourth control signal EN3 and the plurality of respective test mode signals, perform a logic operation, and generate the third enable group signal S2 including $2^{15}$ enable signals.

The fourth address decoder unit 314 includes a plurality of address decoders, which receive the first to fifth address signals A<2:6> and a plurality of enable signals included in the third enable group signal S2. There may be $2^{15}$ address decoders in the fourth address decoder unit 314 to match the number of the enable signals included in the third enable group signal S2, to decode the first to fifth address signals A<2:6> in response to the third enable group signal S2, and accordingly output a maximum of $2^5$ test mode signals. Since each address decoder outputs a maximum of $2^5$ number test mode signals, the fourth address decoder unit 314 resultantly outputs the fourth test mode group signal TM3 with a maximum of $2^{20}$ test mode signals.

In the signal generation block 300 in accordance with an embodiment of the present invention, the plurality of address decoder units 311, 312, 313 and 314 included in the address decoder section 310 and the plurality of enable signal generation units 321, 322 and 323 included in the enable signal generating section 320 generate the plurality of enable group signals S0 to S2 and the plurality of test mode group signals TM0 to TM3.

The test mode signal generation circuit in accordance with the an embodiment of the present invention decodes the plurality of address signals A<2:6> in response to the plurality of control signals EN0 to EN3, and generates the plurality of test mode signals which are included binary-exponentially in the first to fourth test mode group signals TM0 to TM3.

The test mode signal generation circuit in accordance with an embodiment of the present invention decodes the plurality of address signals A<2:6> in response to the plurality of control signals EN0 to EN3, and outputs the first to fourth test mode group signals TM0 to TM3 at multiple stages.

While certain embodiments have been described above, it will be understood to those skilled in the art that the embodiments described are by way of example only. Accordingly, the test mode signal generation circuit described herein should not be limited based on the described embodiments. Rather, the test mode signal generation circuit described herein should only be limited in light of the claims that follow when taken in conjunction with the above description and accompanying drawings.

What is claimed is:

1. A test mode signal generation circuit comprising:
a pre-decoder block configured to output first and second control signals and test address signals in response to first and second address signals; and
a signal generation block configured to decode the test address signals in response to the first control signal and generate first and second test mode group signals each including a plurality of test mode signals.

2. The test mode signal generation circuit according to claim 1, wherein the signal generation block decodes the test address signals in response to the first control signal and generates the first test mode group signal, executes a logical operation for the plurality of respective test mode signals and the second control signal and generates a plurality of enable signals, and generates the second test mode group signal in response to the plurality of enable signals.

3. The test mode signal generation circuit according to claim 2, wherein the signal generation block comprises:
an enable signal generating section configured to execute a logical operation of the second control signal and the first test mode group signal and generate an enable group signal including the plurality of enable signals; and
an address decoder section configured to decode the test address signals in response to the first and second control signals and the enable group signal, and generate the first and second test mode group signals.

4. The test mode signal generation circuit according to claim 3, wherein the address decoder section comprises:
a first address decoder unit configured to decode the test address signals in response to the first control signal and output the first test mode group signal including the plurality of test mode signals; and
a second address decoder unit configured to decode the test address signals in response to the enable group signal and output the second test mode group signal including the plurality of test mode signals.

5. The test mode signal generation circuit according to claim 3, wherein the enable signal generating section comprises:
an enable signal generation unit configured to execute a logical operation for the plurality of respective test mode signals included in the first test mode group signal and the second control signal, and generate the enable group signal including the plurality of enable signals.

6. A test mode signal generation circuit comprising:
a pre-decoder block configured to output a plurality of control signals and a plurality of test address signals in response to a plurality of address signals; and
a signal generation block configured to decode the plurality of test address signals in response to the plurality of control signals, and generate a plurality of test mode group signals each including test mode signals such that the respective numbers of test mode signals of the respective test mode group signals increase exponentially, wherein the plurality of test mode group signals include first to mth test mode group signals (m is a natural number greater than or equal to 2), and when the number of the plurality of test address signals is n (n is a natural number), the number of the test mode signals included in the first and $m^{th}$ test mode group signals is $2^{(1*n)}$ and $2^{(m*n)}$, respectively.

7. The test mode signal generation circuit according to claim 6, wherein the signal generation block comprises:
an enable signal generating section configured to execute a logical operation for the plurality of control signals and the plurality of test mode group signals and generate first to third enable group signals each including a plurality of enable signals; and
an address decoder section configured to decode the plurality of test address signals in response to the plurality of control signals and the plurality of enable group signals, and generate the plurality of test mode group signals.

8. The test mode signal generation circuit according to claim 7, wherein the address decoder section comprises:
a first address decoder unit configured to decode the plurality of test address signals in response to any one of the plurality of control signals and output the first test mode group signal including a plurality of test mode signals;
a second address decoder unit configured to decode the plurality of test address signals in response to the first enable group signal and output the second test mode group signal including a plurality of test mode signals;
a third address decoder unit configured to decode the plurality of test address signals in response to the second enable group signal and output the third test mode group signal including a plurality of test mode signals; and
a fourth address decoder unit configured to decode the plurality of test address signals in response to the third enable group signal and output the fourth test mode group signal including a plurality of test mode signals.

9. The test mode signal generation circuit according to claim 8, wherein the enable signal generating section comprises:
a first enable signal generation unit configured to execute a logic operation for the plurality of respective test mode signals included in the first test mode group signal and any one of the plurality of control signals and generate a plurality of enable signals, and generate the first enable group signal including the plurality of enable signals;
a second enable signal generation unit configured to execute a logic operation for the plurality of respective test mode signals included in the second test mode group signal and any one of the plurality of control signals and generate a plurality of enable signals, and generate the second enable group signal including the plurality of enable signals; and
a third enable signal generation unit configured to execute a logic operation for the plurality of respective test mode signals included in the third test mode group signal and any one of the plurality of control signals and generate a plurality of enable signals, and generate the third enable group signal including the plurality of enable signals.

10. The test mode signal generation circuit according to claim 8, wherein the first test mode group signal is outputted when a control signal among the plurality of control signals which is inputted to the first address decoder unit is enabled, and, when the number of the plurality of test address signals is n (n is a natural number), includes a maximum of $2^n$ test mode signals.

11. The test mode signal generation circuit according to claim 8, wherein the second test mode group signal is outputted when the first enable group signal is enabled, and, when the number of the plurality of test address signals is n (n is a natural number), includes a maximum of $2^{2*n}$ test mode signals.

12. The test mode signal generation circuit according to claim 8, wherein the third test mode group signal is outputted when the second enable group signal is enabled, and, when the number of the plurality of test address signals is n (n is a natural number), includes a maximum of $2^{3*n}$ test mode signals.

13. The test mode signal generation circuit according to claim 8, wherein the fourth test mode group signal is outputted when the third enable group signal is enabled, and, when the number of the plurality of test address signals is n (n is a natural number), includes a maximum of $2^{4*n}$ test mode signals.

14. A test mode signal generation circuit comprising:
a signal generation block configured to decode a plurality of address signals in response to a plurality of control signals, and generate a plurality of test mode group signals each including test mode signals such that the respective numbers of test mode signals of the respective test mode group signals increase exponentially, wherein the plurality of test mode group signals include first to $m^{th}$ test mode group signals (m is a natural number greater than or equal to 2), and when the number of the plurality of address signals is n (n is a natural number), the number of the test mode signals included in the first and mth test mode group signals is $2^{(1*n)}$ and $2^{(m*n)}$, respectively.

15. The test mode signal generation circuit according to claim 14, wherein the signal generation block comprises:
an enable signal generating section configured to execute a logical operation for the plurality of control signals and the plurality of test mode group signals and generate first to third enable group signals each including a plurality of enable signals; and
an address decoder section configured to decode the plurality of address signals in response to the plurality of control signals and the plurality of enable group signals, and generate the plurality of test mode group signals.

16. The test mode signal generation circuit according to claim 14, wherein the address decoder section comprises:
a first address decoder unit configured to decode the plurality of address signals in response to any one of the plurality of control signals and output the first test mode group signal including a plurality of test mode signals;
a second address decoder unit configured to decode the plurality of address signals in response to the first enable group signal and output the second test mode group signal including a plurality of test mode signals;
a third address decoder unit configured to decode the plurality of address signals in response to the second enable group signal and output the third test mode group signal including a plurality of test mode signals; and
a fourth address decoder unit configured to decode the plurality of address signals in response to the third enable group signal and output the fourth test mode group signal including a plurality of test mode signals.

17. The test mode signal generation circuit according to claim 16, wherein the enable signal generating section comprises:
a first enable signal generation unit configured to execute a logic operation for the plurality of respective test mode signals included in the first test mode group signal and any one of the plurality of control signals and generate a plurality of enable signals, and generate the first enable group signal including the plurality of enable signals;
a second enable signal generation unit configured to execute a logic operation for the plurality of respective test mode signals included in the second test mode group signal and any one of the plurality of control signals and generate a plurality of enable signals, and generate the second enable group signal including the plurality of enable signals; and
a third enable signal generation unit configured to execute a logic operation for the plurality of respective test mode signals included in the third test mode group signal and any one of the plurality of control signals and generate a plurality of enable signals, and generate the third enable group signal including the plurality of enable signals.

18. The test mode signal generation circuit according to claim 16, wherein the first test mode group signal is outputted when a control signal among the plurality of control signals which is inputted to the first address decoder unit is enabled, and, when the number of the plurality of address signals is n (n is a natural number), includes a maximum of $2^n$ number test mode signals.

19. The test mode signal generation circuit according to claim 16, wherein the second test mode group signal is outputted when the first enable group signal is enabled, and, when the number of the plurality of address signals is n (n is a natural number), includes a maximum of $2^{2*n}$ test mode signals.

20. The test mode signal generation circuit according to claim 16, wherein the third test mode group signal is outputted when the second enable group signal is enabled, and, when the number of the plurality of address signals is n (n is a natural number), includes a maximum of $2^{3*n}$ test mode signals.

21. The test mode signal generation circuit according to claim 16, wherein the fourth test mode group signal is outputted when the third enable group signal is enabled, and, when the number of the plurality of address signals is n (n is a natural number), includes a maximum of $2^{4*n}$ test mode signals.

* * * * *